(12) United States Patent
Roskos et al.

(10) Patent No.: US 9,190,956 B2
(45) Date of Patent: Nov. 17, 2015

(54) SUBHARMONIC MIXER

(75) Inventors: Hartmut G. Roskos, Kronberg (DE);
Alvydas Lisauskas, Frankfurt (DE);
Sebastian Boppel, Frankfurt (DE)

(73) Assignee: Johann Wolfgang Goethe-Universitat Frankfurt a.M., Frankfurt am Main (DE)

( * ) Notice: Subject to any disclaimer, the term of this patent is extended or adjusted under 35 U.S.C. 154(b) by 112 days.

(21) Appl. No.: 13/697,824

(22) PCT Filed: May 13, 2011

(86) PCT No.: PCT/EP2011/057794
§ 371 (c)(1),
(2), (4) Date: Jan. 10, 2013

(87) PCT Pub. No.: WO2011/141572
PCT Pub. Date: Nov. 17, 2011

(65) Prior Publication Data
US 2014/0145778 A1    May 29, 2014

(30) Foreign Application Priority Data
May 14, 2010   (DE) .......................... 10 2010 028 987

(51) Int. Cl.
*G06F 7/44* (2006.01)
*H03D 7/12* (2006.01)

(52) U.S. Cl.
CPC ..................................... *H03D 7/125* (2013.01)

(58) Field of Classification Search
USPC .......... 327/355, 356, 359, 361; 455/323, 326, 455/332, 333
See application file for complete search history.

(56) References Cited

U.S. PATENT DOCUMENTS

| | | | |
|---|---|---|---|
| 4,814,649 A | 3/1989 | Young | |
| 5,465,418 A | 11/1995 | Zhou et al. | |
| 5,551,076 A | 8/1996 | Bonn | |
| 6,163,689 A | 12/2000 | Lee | |
| 8,249,541 B2 * | 8/2012 | Bao et al. | 455/333 |
| 8,547,158 B2 * | 10/2013 | Pfeiffer et al. | 327/356 |
| 2008/0284488 A1 * | 11/2008 | Sanduleanu et al. | 327/356 |
| 2008/0287088 A1 * | 11/2008 | Bao et al. | 455/333 |

FOREIGN PATENT DOCUMENTS

| | | |
|---|---|---|
| DE | 10 2008 047101 A1 | 3/2010 |
| DE | 10 2008 047103 A1 | 3/2010 |
| EP | 0 033 920 A1 | 8/1981 |
| EP | 0 321 254 A1 | 6/1989 |

* cited by examiner

*Primary Examiner* — Long Nguyen
(74) *Attorney, Agent, or Firm* — Paul & Paul

(57) ABSTRACT

A sub-harmonic electronic mixer has at least one field effect transistor (FET) having a gate, source, and drain; and a useful signal input at a useful frequency; and a local oscillator input. The input receives the oscillator signal at a frequency being an integral fraction of the useful frequency, plus or minus a mixing frequency to provide a signal output. A gate of the FET and/or the drain and/or the source receives the useful signal to generate a gate-source voltage and/or a drain-source voltage whereby the gate receives the local oscillator signal to generate a gate-source voltage, and the drain or a source receives the local oscillator signal to generate a drain-source voltage. A phase shift is introduced between the signal received at the gate and the signal received at the drain or source of the FET.

11 Claims, 8 Drawing Sheets

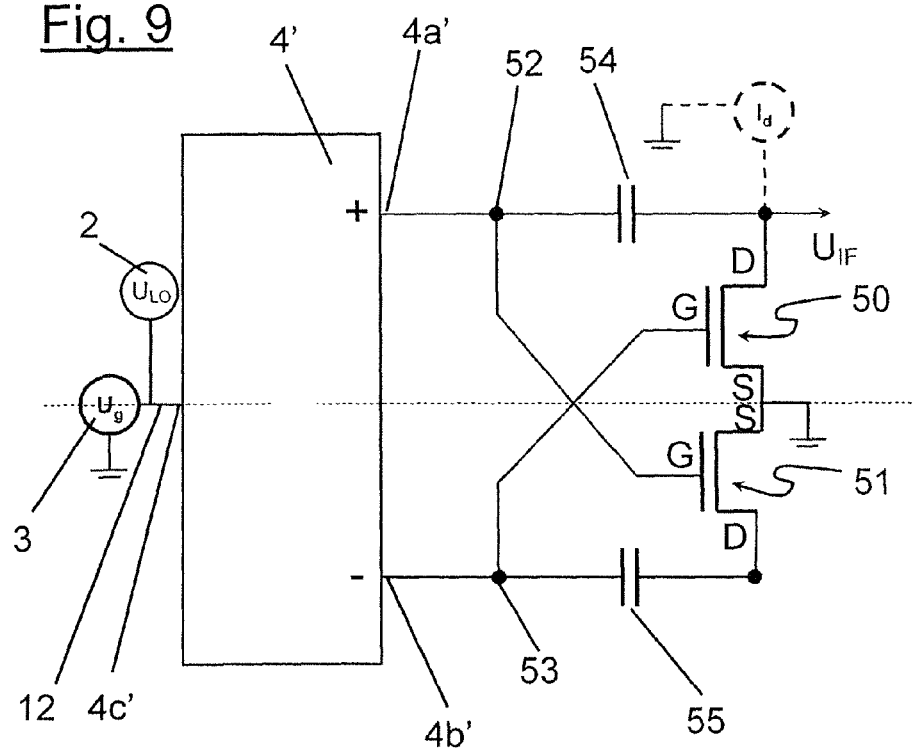
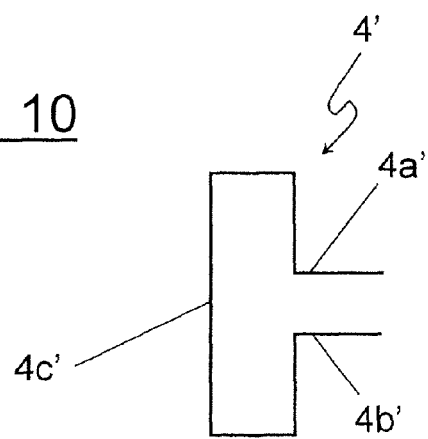

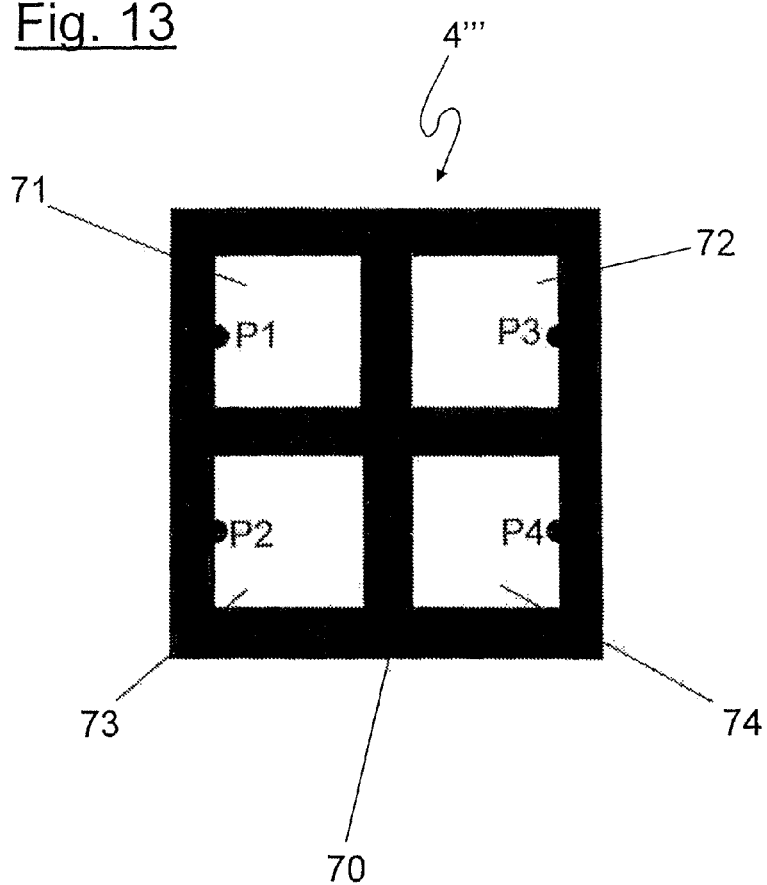

SUBHARMONIC MIXER

BACKGROUND OF THE INVENTION

The present invention concerns an electronic mixer for generating a mixed signal by mixing a local oscillator signal with a useful signal comprising at least one field effect transistor which has at least one gate, at least one source and at least one drain, a useful signal input for feeding in the useful signal with a useful frequency, a local oscillator signal input for feeding in the local oscillator signal, which is so designed that in operation of the mixer it receives a local oscillator signal whose local oscillator frequency is equal to an integral fraction of the useful frequency which is reduced or increased by a mixing frequency, and a signal output at which the mixed signal is present in operation of the mixer.

The present invention further concerns a method of generating a mixed signal by mixing a local oscillator signal with a useful signal in at least one field effect transistor having at least one gate, at least one source and at least one drain, comprising the step of generating the local oscillator signal with a local oscillator frequency, wherein the local oscillator frequency is equal to an integral fraction of the useful frequency which is reduced or increased by the mixing frequency.

For efficiently acquiring electromagnetic signals beat receivers, in particular heterodyne receivers, have long been used, in which the electromagnetic signal to be acquired, which is referred to hereinafter as the useful signal, is mixed with a signal which is generated locally, that is to say at or in the mixer itself, which hereinafter is referred to as the local oscillator signal. The mixed signal then has a mixing frequency which is equal to the differential frequency between the frequency of the useful signal, this is referred to hereinafter as the useful frequency, and the frequency of the local oscillator signal, this is referred to hereinafter as the local oscillator frequency. The amplitude of the mixed signal is a measurement in respect of the amplitude of the useful signal. The signal identified as the mixed signal with the mixing frequency in the present application as the output of the mixer is frequently also referred to in the literature as the intermediate frequency signal with the intermediate frequency.

The terahertz frequency range or submillimeter wavelength range which is roughly defined by between 100 gigahertz (GHz) and 10 terahertz (THz) is one of the last 'dark' areas of the electromagnetic spectrum.

Technically usable detectors are not commercially available in that frequency range or are commercially available only at low frequencies. In particular the mixing efficiency of field effect transistors which are frequently used for mixing a useful signal with a local oscillator signal drops off severely towards higher useful frequencies.

In that respect however the efficiency of the mixers also depends on the available power of the local oscillator signal. Powerful local oscillator sources are not available at high terahertz frequencies, or are so available only at a high level of technical and financial complication and expenditure. Therefore it is known from the state of the art to use a local oscillator which generates a local oscillator signal whose local oscillator frequency is equal to an integral fraction of the useful frequency increased or reduced by the mixing frequency. Such a mixing method is referred to as subharmonic mixing.

In subharmonic mixing, the non-linear properties of the mixer component, thus also in the case of the field effect transistor, are put to use. A mixed product is generated with the difference of an integral multiple of the local oscillator frequency and the useful frequency.

It will be noted however that the efficiency of subharmonic mixing is markedly lower than the mixing efficiency upon coupling the fundamentals involving the same power into the mixer element, in particular the field effect transistor.

SUMMARY OF THE INVENTION

Therefore the object of the present invention is to provide an electronic mixer which permits subharmonic mixing with increased mixing efficiency.

According to the invention that object is attained by the provision of an electronic mixer for generating a mixed signal by mixing a local oscillator signal with a useful signal comprising at least one field effect transistor which has at least one gate, at least one source and at least one drain, a useful signal input for feeding in the useful signal with a useful frequency, a local oscillator signal input for feeding in the local oscillator signal, which is so designed that in operation of the mixer it receives a local oscillator signal whose local oscillator frequency is an integral fraction of the useful frequency of the useful signal, plus or minus a mixing frequency of the mixed signal, and a signal output at which the mixed signal is present in operation of the mixer, wherein the mixer is so adapted that in operation of the mixer for generating a gate-source voltage and/or a drain-source voltage at least one gate of the field effect transistor and/or the drain and/or the source receive the useful signal from the useful signal input, wherein the mixer is so adapted that in operation of the mixer for generating a gate-source voltage at least one gate of the field effect transistor receives the local oscillator signal from the local oscillator signal input, and the mixer is so adapted that in operation of the mixer the drain or the source of the field effect transistor for generating a drain-source voltage receives the local oscillator signal from the local oscillator signal input, and wherein the mixer is so adapted that in operation of the mixer a phase shift of between 0° and 360° is introduced between the local oscillator signal received by the gate of the field effect transistor and the local oscillator signal received by the drain or the source of the field effect transistor.

The crucial idea for improving a mixer on the basis of a field effect transistor is according to the invention that the local oscillator signal is simultaneously coupled both into the gate and also into the drain or alternatively simultaneously into the gate and the source of the field effect transistor. In that way the local oscillator signal contributes to the gate-source voltage and to the drain-source voltage.

Such simultaneous coupling of the local oscillator signal into the gate and the drain however is not sufficient for an increase in mixing efficiency. Rather, a phase shift of between 0° and 360° must be introduced between the signal components of the local oscillator signal, that are respectively present at the gate and drain or source.

When in accordance with the present application reference is made to a field effect transistor (FET) that is intended to denote all voltage-controlled unipolar transistors which for the man skilled in the art are embraced by that term. In that respect most field effect transistors have symmetrical properties in regard to source and drain so that the designation of source and drain depends exclusively on the circuitry of the element. In that respect it is immaterial for the circuit according to the invention whether the useful signal and/or the local oscillator signal is coupled into the source or the drain of the transistor. If it is stated in the description hereinafter that the signals are coupled into the drain, that is only for the purposes of linguistic simplification and better linguistic understanding. As an alternative to coupling into the drain, with suitable circuitry, coupling of the signals into the transistor source is also possible.

When mention is made in the description hereinafter and in the claims of the fact that coupling is effected into the gate and the drain or the source that means that coupling is effected both into the gate and also into the drain or the source.

In an embodiment the signals to be mixed, the useful signal and the local oscillator signal, are both coupled into at least one of the gates and also into the drain of the field effect transistor. In that respect, in such an embodiment, it is advantageous but not compellingly necessary if phase shifts of between 0° and 360° are introduced between the signal components respectively present at gate and drain, both of the useful signal and also of the local oscillator signal.

In an embodiment the field effect transistor is a multigate field effect transistor, that is to say a field effect transistor having a plurality of gates. In such an embodiment it is sufficient for at least one of the gates to be supplied with the useful signal and at least one of the gates to be supplied with the local oscillator signal. In that respect, in an embodiment, it is possible for at least one of the gates of the multigate field effect transistor to be supplied both with the useful signal and also with the local oscillator signal, as is the case in respect of a field effect transistor with only one gate.

In that respect, embodiments in particular are possible in which more than one useful signal and more than one local oscillator signal are coupled into the mixer or there are provided more than one useful signal input and more than one local oscillator signal input.

In an embodiment of the mixer the useful signal input and/or the local oscillator signal input are formed by an antenna.

In a further embodiment of the mixer according to the invention the local oscillator signal input is connected to a local oscillator for generating the local oscillator signal, wherein the local oscillator is so adapted that in operation of the mixer it generates a local oscillator signal whose local oscillator frequency is an integral fraction of the useful frequency of the useful signal, that is reduced or increased by a mixing frequency of the mixed signal.

To introduce the phase shift between the signal components of useful signal and local oscillator signal respectively at gate and drain the mixer in an embodiment has at least one phase-shifting element.

Phase-shifting elements are known from the state of the art in a whole range of different configurations. Thus for example phase shifts can be implemented by delay sections which introduce a transit time difference and thus a phase shift between two signal paths. Alternatively thereto it is possible to use electronic components but also so-called geometrical phase shifters which, by virtue of their topological properties, are capable of altering the phase position of a signal.

The expression phase-shifting element in accordance with the present invention is used to denote all those elements which introduce a phase shift between the signals at their input and output or which provide at two different outputs signal components having a relative phase shift with respect to each other. Besides the elements which are generally referred to as phase-shifting, they also include in particular inverters and multipliers. A differential antenna which at its connecting points provides a signal in push-pull relationship also affords a phase-shifting element in accordance with the present invention. The field effect transistor itself, in an embodiment, can also perform the function of the phase-shifting element, for example using plasmonic signal propagation.

The term subharmonic mixer in accordance with the present invention denotes a mixing process in which the local oscillator signal has a local oscillator frequency which is an integral fraction of the useful frequency reduced or increased by the mixing frequency. Expressed mathematically, in the case of the subharmonic mixing operation according to the invention, the local oscillator frequency $v_{LO}$ of the available local oscillator signal is calculated as follows:

$$v_{LO} = (v_{RF} \pm v_{IF}) \frac{1}{n}.$$

Therein $v_{RF}$ is the useful frequency of the useful signal RF and $v_{IF}$ is the frequency of the mixed signal IF which is considered as the output product of the mixer. In the formula n is an integer and denotes the harmonic of the local oscillator frequency that must be generated in the mixer to afford a mixed product at the frequency $v_{IF}$.

In an embodiment of the invention the useful frequency $v_{RF}$ of the useful signal is in the so-called terahertz frequency range, that is to say in accordance with the present invention in a frequency range of between 100 GHz and 10 THz.

If for example a terahertz signal at 300 GHz is to be received as the useful signal, in which case the mixed signal has a mixing frequency $v_{IF}$ of 100 MHz that is simple to process, it is desirable if the local oscillator signal has a local oscillator frequency at the fourth subharmonic displaced by the 100 MHz, that is to say:

$$v_{LO} = (300 \text{ GHz} - 100 \text{ MHz}) \cdot \frac{1}{4}.$$

The mixing frequency $v_{IF}$ is desirably in a range of DC up to 100 GHz and is preferably in a range of between 1 MHz and 1 GHz.

While an increase in efficiency is already afforded when a phase shift is introduced only between the signal components at gate and drain either of the useful signal or the local oscillator signal it is advantageous if in an embodiment a phase shift is introduced between the signal components at gate and drain both of the useful signal and also of the local oscillator signal.

In that case, in an embodiment, the phase shift introduced between the signal components at gate and drain of the useful signal and/or of the local oscillator signal is 180° or π. A phase shift of 180° causes a maximum increase in mixing efficiency. In that respect the change in mixing efficiency is 2 π-periodic. In other words a relative phase shift by 180° leads to the same result as a relative phase shift by 540°.

It is known from the state of the art, for mixing a useful signal with a useful frequency in the terahertz frequency range and a local oscillator signal, to feed the useful signal into the drain of a field effect transistor and to feed the local oscillator signal into the gate. Such an arrangement is shown in FIG. 1. This classic situation also uses generally subharmonics of the useful frequency as the local oscillator frequency in order to be able to operate the local oscillator frequency at frequencies that are available at an inexpensive price.

On the assumption of dividing local oscillator signal and useful signal at 50:50 to gate and drain and a phase shift of 180° between the respective signal components of useful signal and local oscillator signal at gate and drain the mixing efficiency is increased in relation to the second harmonic by 2.475, in relation to the third harmonic by 3.75 and in relation to the fourth harmonic by 5.48.

In other words, by virtue of the increase in efficiency by the phase shifts according to the invention between the respective signal components at gate and drain the local oscillator signal is provided with a correspondingly reduced level of power at the local oscillator frequency $v_{LO}$.

In an embodiment of the invention the field effect transistor is operated in a non-classic mode as a so-called plasma field effect transistor above its transistor limit frequency. That is to say, the useful frequency of the useful signal $v_{RF}$ is greater than the transistor limit frequency.

In operation above the transistor limit frequency the field effect transistor no longer acts as an amplifier so that in this case the mixer according to the invention and the mixing method provides the most marked increase in mixing efficiency. It will be noted however that this does not exclude an additional increase in mixing efficiency by applying a DC bias voltage. Plasmonic effects can also lead in that mode to an increase in mixing efficiency. Transit time effects play a phase-influencing part.

In an embodiment of the invention the mixer has at least one splitter and at least one combinator, the splitter and the combinator being so arranged that in operation of the mixer the gate of the field effect transistor and the drain of the field effect transistor receive both the useful signal and also the local oscillator signal.

In that respect in accordance with the present invention the term splitter denotes a component which is capable of distributing a signal input to at least two signal outputs. In contrast the term combinator denotes a component capable of bringing at least two signal inputs together to a signal output.

In the simplest case however a splitter and a combinator can be formed by a point on a circuit, at which at least two lines come together and join to form a single one. Whether such a point is a splitter or a combinator is decided then in dependence on the signal direction.

In an embodiment the splitter and combinator can also be formed by a single element having at least two input connections and at least two output connections (a so-called 2×2 coupler).

In an embodiment the mixer has a first splitter, a second splitter, a first phase-shifting element, a second phase-shifting element, a first combinator and a second combinator, wherein the first splitter is so adapted that in operation of the mixer it receives the useful signal from the useful signal input and outputs the useful signal to the gate and the drain, wherein the second splitter is so adapted that in operation of the mixer it receives the local oscillator signal from the local oscillator signal input and outputs the local oscillator signal to the gate and the drain, wherein the first phase-shifting element is between the first splitter and the gate of the field effect transistor or between the first splitter and the drain of the field effect transistor and wherein the first phase-shifting element is so adapted that it introduces a phase shift, preferably of 180°, between the useful signal received by the gate of the field effect transistor and the useful signal received by the drain of the field effect transistor, wherein the second phase-shifting element is between the second splitter and the gate of the field effect transistor or between the first splitter and the drain of the field effect transistor and wherein the second phase-shifting element is so adapted that it introduces a phase shift, preferably of 180°, between the local oscillator signal received by the gate of the field effect transistor and the local oscillator signal received by the drain of the field effect transistor, wherein the first combinator is so adapted that in operation of the mixer it receives the useful signal from the first splitter and the local oscillator signal from the second splitter and outputs the useful signal and the local oscillator signal to the drain of the field effect transistor and wherein the second combinator is so adapted that in operation of the mixer it receives the useful signal from the first splitter and the local oscillator signal from the second splitter and outputs the useful signal and the local oscillator signal to the drain of the field effect transistor.

Such an arrangement has the advantage that the first and second phase-shifting elements are respectively arranged in portions of the circuit through which flows either only the useful signal or only the local oscillator signal so that the phase-shifting elements can be optimised for the local oscillator frequency or the useful frequency respectively and the two phase-shifting elements do not influence the respective other signal.

In an alternative embodiment the mixer has precisely one phase-shifting element, wherein the phase-shifting element is so arranged that in operation of the mixer it receives both the useful signal and also the local oscillator signal and outputs both the useful signal and also the local oscillator signal to the gate or to the drain of the field effect transistor, and wherein the phase-shifting element is so adapted that in operation of the mixer it introduces a phase shift, preferably of 180°, both between the useful signal received by the gate of the field effect transistor and the useful signal received by the drain of the field effect transistor and also between the local oscillator signal received by the gate of the field effect transistor and the local oscillator signal received by the drain of the field effect transistor.

Such an arrangement in which the useful signal and the local oscillator signal are firstly superimposed at a combinator and are then divided to two mutually separate lines for feeding to the gate and the drain has the advantage that it manages with only one single phase-shifting element.

It has possibly been found to be disadvantageous that, in the event of a random selection of the useful frequency $v_{RF}$ and the local oscillator frequency $v_{LO}$ the two signals experience different phase shifts by the single phase-shifting element.

In an embodiment of the invention therefore a delay section is selected for the phase-shifting element while the mixer receives a local oscillator signal at a local oscillator frequency which is an odd integral fraction of the useful frequency of the useful signal, that is increased or reduced by the mixing frequency. If in that case the delay section is so selected as the phase-shifting element that it introduces precisely a phase shift of 180° for the useful frequency $v_{RF}$, as is optimum for increasing efficiency, the phase is also shifted by about 180° for the odd subharmonic.

In an embodiment the preferably single phase-shifting element is a transformer having at least two coils. In that case, one of the coils, in an embodiment the primary coil, is connected to the drain of the field effect transistor and the other coil, in an embodiment the secondary coil, is connected to the gate of the field effect transistor. In addition one of the coils is connected to the signal inputs for the useful signal and the local oscillator signal. By virtue of the inherent properties of the transformer it provides not only as a splitter for dividing the useful signal and the local oscillator signal to gate and drain of the field effect transistor, but also for the phase shift according to the invention between the signal components of the useful signal at gate and drain and between the signal components of the local oscillator signal at gate and drain.

In an embodiment the transformer also serves for impedance matching. For that purpose it is equipped with a primary coil and two secondary coils. The primary coil is connected to the signal inputs for the useful signal and the local oscillator signal while the first secondary coil is connected to the gate of the field effect transistor and the second secondary coil is connected to the drain of the field effect transistor.

In a further alternative embodiment the mixer has a first and a second splitter, a first phase-shifting element with two output connections and a first and a second field effect transistor, wherein the first phase-shifting element is so arranged and adapted that in operation of the mixer it receives the useful signal and/or the local oscillator signal and introduces a phase shift of preferably 180° between the signal components of the useful signal and/or of the local oscillator signal at its two output connections, wherein the first splitter is so arranged that in operation of the mixer it receives the useful signal and/or the local oscillator signal from an output connection of the first phase-shifting element and outputs the useful signal and/or the local oscillator signal at a first and a second output, wherein the second splitter is so arranged that in operation of the mixer it receives the useful signal and/or the local oscillator signal from an output connection of the first phase-shifting element and outputs the useful signal and/or the local oscillator signal at a first and a second output, wherein the first field effect transistor is so arranged that in operation of the mixer its gate receives the useful signal and/or the local oscillator signal from the second output of the second splitter and its drain receives the useful signal and/or the local oscillator signal from the first output of the first splitter, and wherein the second field effect transistor is so arranged that in operation of the mixer its gate receives the useful signal and/or the local oscillator signal from the second output of the first splitter and its drain receives the useful signal and/or the local oscillator signal from the first output of the second splitter.

In such an embodiment it is desirable if the first phase-shifting element is formed by a differential antenna. That serves at the same time as a useful signal input and/or local oscillator input as it receives the useful signal and/or the local oscillator signal.

In an embodiment the first phase-shifting element is a differential antenna which receives both the useful signal and also the local oscillator signal. Then both signal components of the useful signal and also of the local oscillator signal that are respectively phase-shifted relative to each other through 180° occur at the two output connections.

Examples of such a differential antenna are in particular a half-wave folded dipole antenna, a loop antenna and a patch antenna. The specified antenna types are antennas at whose antenna foot points or connections the received useful signal is outputted in push-pull relationship, that is to say with a phase shift of 180°.

If a signal component is branched off each output connection of such a differential antenna and same is applied in crossed-over relationship to the gate of one of the two field effect transistors while the second signal component is applied to the drain of the respective other field effect transistor, then useful and/or local oscillator signals which are phase-shifted through 180° relative to each other occur at gate and drain of each of the two field effect transistors.

In a further embodiment the mixer according to the invention has a first and a second phase-shifting element, wherein the first phase-shifting element is formed by a differential antenna as the useful signal input and wherein the second phase-shifting element is formed by a differential antenna as the local oscillator signal input.

In an alternative embodiment the antenna is of such a configuration that it receives the useful signal in freely radiating relationship and receives the local oscillator signal from the local oscillator by way of an electrical connecting line, passes it through the antenna and outputs it by way of the connecting or foot points of the antenna. The local oscillator signal which is fed into the mixer in that way is outputted at the connecting points of the differential antenna in phase relationship. In that sense the differential antenna then acts as a splitter for the local oscillator signal. If the feed of the local oscillator signal into the mixer is effected symmetrically into the differential antenna then the local oscillator signal occurs in in-phase relationship, that is to say without phase shift, at the output connections of the antenna. With an asymmetrical feed a phase shift can be achieved between the signal components at the two output connections.

In an embodiment of the invention the gate of the field effect transistor is biased with a dc voltage. In that case the mixer preferably has a bias voltage source which in an embodiment is connected by way of a bias tee to the gate of the field effect transistor.

The above-specified object is also attained by a method of generating a mixed signal by mixing a local oscillator signal with a useful signal in at least one field effect transistor having at least one gate, at least one source and at least one drain, comprising the steps of generating the local oscillator signal with a local oscillator frequency, wherein the local oscillator frequency is an integral fraction of the useful frequency of the useful signal plus or minus the mixing frequency of the mixed signal, feeding the useful signal having a useful frequency into at least one gate and/or the drain of the field effect transistor, feeding the local oscillator signal into at least one gate and the drain of the same field effect transistor, and introducing a phase shift of between 0 and 360° between the local oscillator signal at the gate and the local oscillator signal at the drain of the field effect transistor.

In an embodiment of the method according to the invention the useful signal is fed into at least one gate and also into the drain of the field effect transistor. In that respect it is advantageous but not necessary to introduce a phase shift both between the useful signal at the gate and the useful signal at the drain of the field effect transistor and also between the local oscillator signal at the gate and the local oscillator signal at the drain of the field effect transistor. It is possible in that way to achieve an optimum increase in the mixing efficiency in subharmonic mixing.

In a further embodiment the phase shift is 180°. With a phase shift of 180° there is an optimum in respect of the increase in efficiency of the mixing process, irrespective of whether optimisation of the phase shift between the signal components of the useful signal or the signal components of the local oscillator signal is considered.

DESCRIPTION OF THE DRAWINGS

Further advantages, features and possible uses of the present invention are clearly apparent from the description hereinafter, embodiments and the accompanying Figures.

FIG. 9 shows a further embodiment of the electronic mixer according to the invention, FIG. 10 shows an example of a differential antenna from the FIG. 9 mixer, FIG. 13 shows a dual-frequency antenna for the embodiment of the mixer according to the invention in FIG. 12.

DESCRIPTION OF THE INVENTION

Figure 1:
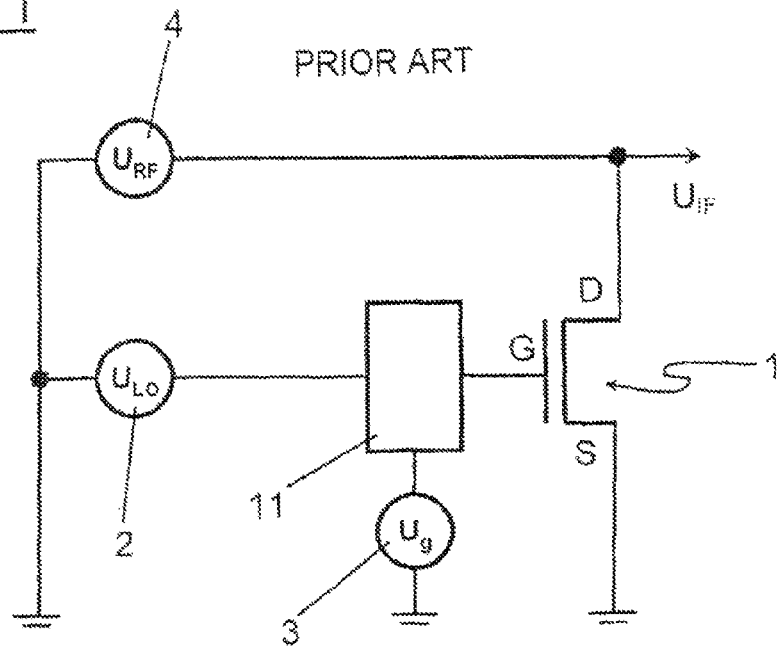
FIG. 1 shows an electronic mixer from the state of the art.

FIG. 1 shows a mixer circuit from the state of the art. The core portion of the mixer is a field effect transistor 1 comprising a gate G, a drain D and a source S. In the field effect transistor 1 a high frequency signal RF with a signal voltage $U_{RF}$ and a local oscillator signal LO with a local oscillator voltage $U_{LO}$ are to be mixed together to produce a mixed signal IF with a signal voltage $U_{IF}$. By virtue of the mixing properties of the field effect transistor the mixing frequency $v_{IF}$ is equal to the difference between the useful frequency $v_{RF}$ of the high frequency signal RF and the local oscillator frequency $v_{LO}$ of the local oscillator signal LO. In accordance with the description and claims the high frequency signal RF is the useful signal, that is to say the amplitude of that signal, is to be detected by means of the detection device as is shown in FIG. 1 for the state of the art and in the further Figures in accordance with the invention.

To operate the field effect transistor 1 of FIG. 1 as a mixer the high frequency signal RF is applied to the drain D of the field effect transistor 1 so that the high frequency signal generates a drain-source voltage $U_{DS}$. In contrast the local oscillator signal LO generated by the local oscillator 2 is applied to the gate G of the field effect transistor 1 so that it causes a gate-source voltage $U_{GS}$ in the field effect transistor 1. The drain-source voltage $U_{DS}$ is given as follows:

$$U_{DS} = U_{RF} \cdot \sin(\omega_{RF} \cdot t),$$

wherein $\omega_{RF}$ is the annular frequency associated with the useful frequency $v_{RF}$. In comparison the gate-source voltage $U_{GS}$ is given by the following expression:

$$U_{GS} = U_{LO} \cdot \sin(\omega_{LO} \cdot t),$$

wherein $\omega_{LO}$ is the annular frequency associated with the local oscillator frequency $v_{LO}$.

As local oscillators at the typical useful frequencies to be considered here are not available with sufficient power in the terahertz frequency range, that is to say between 100 GHz and 10 THz, a frequency is selected as the local oscillator frequency $v_{LO}$, which is equal to an integral fraction of the useful frequency $v_{RF}$ increased or reduced by the mixing frequency $v_{IF}$. Apart from the shift by the mixing frequency $v_{IF}$ therefore the local oscillator frequency $v_{LO}$ is a subharmonic of the useful frequency $v_{RF}$.

The small-signal approximation involves the following amplitudes for the mixed signal of the different harmonics:

| Harmonic | Amplitude of the mixed signals |
|---|---|
| 1 | $\frac{1}{2} \frac{U_{LO} U_{RF}}{U_t}$ |
| 2 | $\frac{1}{8} \frac{U_{LO}^2 U_{RF}}{U_t^2}$ |
| 3 | $\frac{1}{48} \frac{U_{LO}^3 U_{RF}}{U_t^3}$ |
| 4 | $\frac{1}{384} \frac{U_{LO}^4 U_{RF}}{U_t^4}$ |
| n | $\frac{1}{2^n n!} \frac{U_{LO}^n U_{RF}}{U_t^n}$ |

Hereinafter the amplitudes of the mixed signals generated with the mixers according to the invention are standardised to those amplitudes of the mixed signals and the standardised parameter is referred to as the increase in mixing efficiency.

To be able to operate the field effect transistor 1 at an optimum working point the gate is biased with a dc voltage by means of a bias voltage source 3 connected by way of a bias tee to the feed line of the local oscillator 2 to the gate G.

Hereinafter for the sake of simplicity identical elements, that is to say those involving an identical function, are denoted by identical references.

Figure 2:
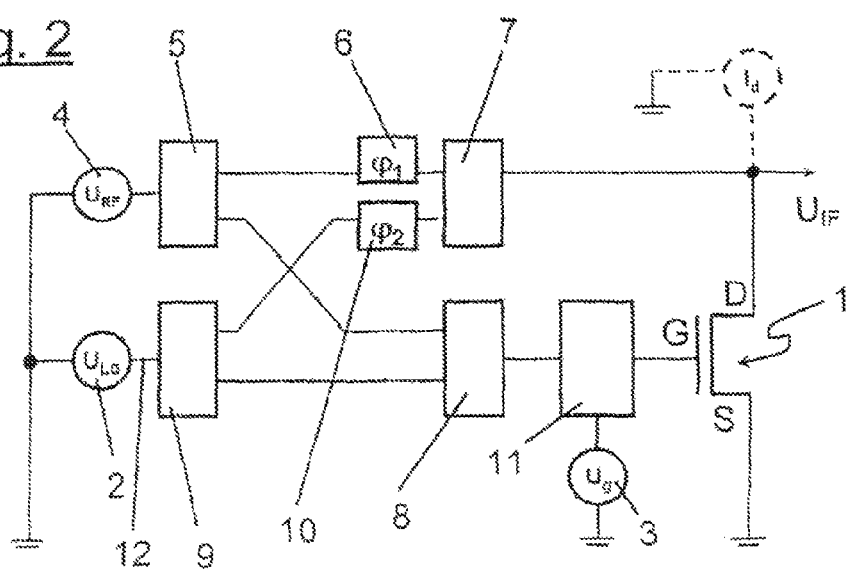
FIG. 2 shows a first embodiment of the electronic mixer.

FIG. 2 shows an electronic mixer for mixing a useful signal RF with a local signal oscillator LO in a field effect transistor 1 comprising a gate G, a drain D and a source S. To generate the local oscillator signal LO at the local oscillator frequency $v_{LO}$ there is available a local oscillator 2 which is a component part of the mixer.

The useful signal RF at the voltage amplitude $U_{RF}$ is received by means of an antenna 4 diagrammatically shown in FIG. 2 and fed into the mixer by the antenna.

In the illustrated embodiment by way of example a useful signal RF at a useful frequency of 300 GHz is considered. A mixed signal IF of a mixing frequency of $v_{IF}$ of 150 MHz is to be generated. For that purpose the local oscillator 2 provides a local oscillator frequency at the fourth harmonic of the useful frequency reduced by the mixing frequency. Expressed mathematically the local oscillator frequency is calculated as follows:

$$v_{LO} = (v_{RF} - v_{IF}) \frac{1}{4}.$$

The aim of the mixer circuit according to the invention shown in FIG. 2 is now to feed the useful signal RF and the local oscillator signal LO both into the gate G and also into the drain D. At the same time a phase shift is to be introduced between the signal components of the useful signal RF at gate G and drain D of the field effect transistor 1, and also between the signal components of the local oscillator signal LO which occur at gate and drain of the field effect transistor 1.

For that purpose the antenna 4 is connected to a first splitter 5 which splits the useful signal RF into two signal components of which the first is connected to the drain D of the field effect transistor 1 by way of a first phase shifter 6 and a first combinator 7. The second output of the first splitter 5 is connected to the gate G of the field effect transistor 1 by way of a second combinator 8.

The local oscillator 2 is connected to a second splitter 9 which also divides the local oscillator signal LO to two outputs. The one output of the splitter 9 is connected to the first combinator 7 by way of a second phase shifter 10 so that the useful signal RF and the local oscillator signal LO are superimposed at the first combinator 7 and are provided at a common output of the comparator 7 for the drain D of the field effect transistor 1.

The second output of the second splitter 9 is connected to the second combinator 8 so that here too the useful signal RF and the local oscillator signal LO are superimposed on each other and provided for the gate G of the field effect transistor 1.

In order to be able to operate the field transistor 1 at its optimum working point as previously there is provided a bias voltage source 3 which feeds a dc bias voltage by way of a bias tee 11 into the gate G of the field effect transistor 1.

The gate-source AC voltage for the mixer arrangement according to the invention in FIG. 2 is calculated as follows:

$$U_{GS}=\sqrt{r}\cdot U_{LO}\cdot\sin(\omega_{LO}\cdot t)+\sqrt{s}U_{RF}\cdot\sin(\omega_{RF}\cdot t)$$

and the drain-source voltage arises from the following expression:

$$U_{DS}=\sqrt{1-r}\cdot U_{LO}\sin(\omega_{LO}\cdot t+\phi_{LO})+\sqrt{1-s}\cdot U_{RF}\sin(\omega_{RF}\cdot t+\phi_{RF}).$$

In that respect r describes the component of the local oscillator signal power which is applied to the gate so that $1-r$ is the local oscillator signal power at the drain. Therein s describes the component of the useful signal power which is applied to the gate so that $1-s$ denotes the useful signal power at the drain. In addition $\phi_{LO}$ describes the phase shift, introduced by the second phase shifter 10, in the signal components of the local oscillator signal at gate and drain, while $\phi_{RF}$ describes the phase shift between the signal components of the useful signal RF, that are applied to gate and drain.

The mathematical limit case with $r=1$ and $s=0$ describes the arrangement in the state of the art as shown in FIG. 1.

Figure 3:
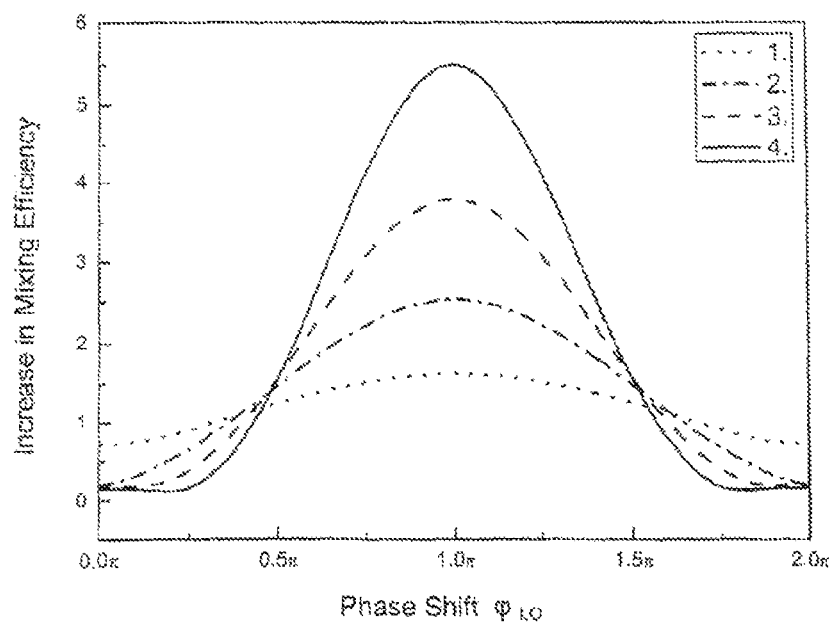
FIG. 3 shows a graph plotting the increase in mixing efficiency against the phase shift between the signal components of the local oscillator signal at gate and drain of the field effect transistor.

FIG. 3 shows a graph plotting the increase in mixing efficiency in comparison with the phase shift $\phi_{LO}$ between the signal components of the local oscillator signal at gate and drain. It is apparent that optimised mixing efficiency is achieved when the phase shift is $\pi$ or 180°.

Figure 4:
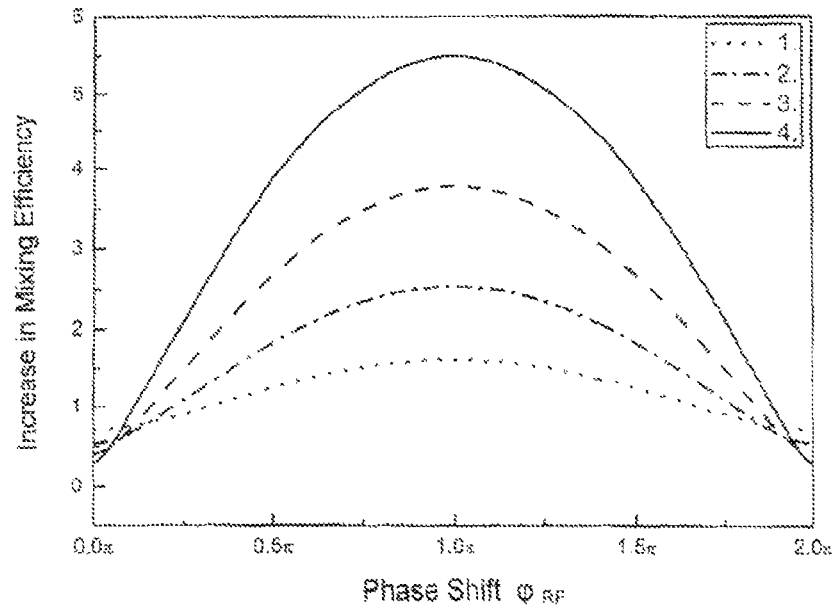
FIG. 4 shows a graph plotting the increase in mixing efficiency against the phase shift between the signal components of the useful signal at gate and drain of the field effect transistor.

FIG. 4 in comparison shows a graph plotting the increase in mixing efficiency in relation to the phase shift $\phi_{RF}$ between the signal components of the useful signal at gate and drain. In this case also there is a maximum increase in mixing efficiency at a phase shift of $\pi$ or 180°.

Figure 5:
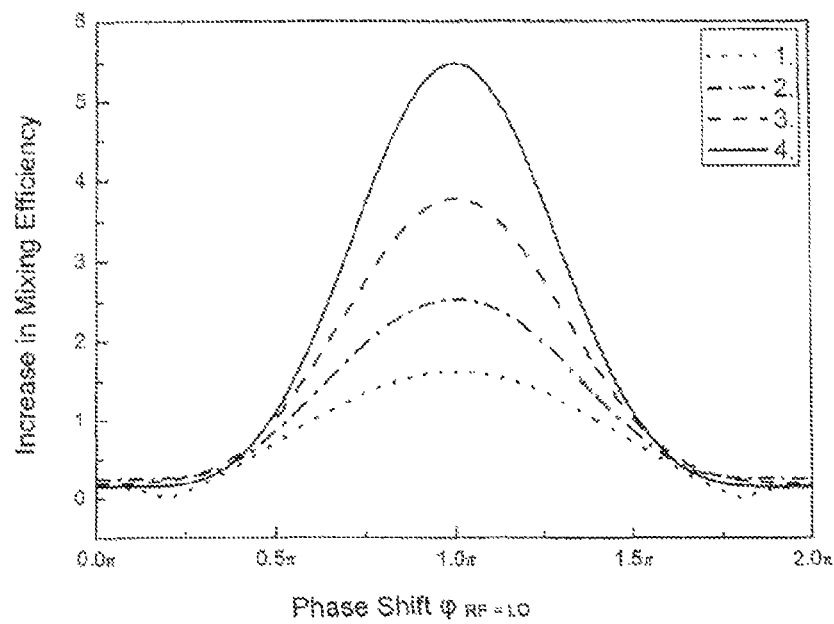
FIG. 5 shows a graph plotting the increase in mixing efficiency against the phase shift between the signal components of the useful signal and the local oscillator signal at gate and drain of the field effect transistor.

FIG. 5 shows a graph in which the increase in mixing efficiency is plotted against a phase shift both between the signal components of the useful signal RF at gate and drain and also between the signal components of the local oscillator signal LO at gate and drain, wherein $\phi_{RF}=\phi_{LO}$. In this case also it can be seen that it is advantageous to introduce a phase shift of $\pi$ or 180° respectively between the signal components of the useful signal RF and also between those of the local oscillator signal LO.

Figure 6:
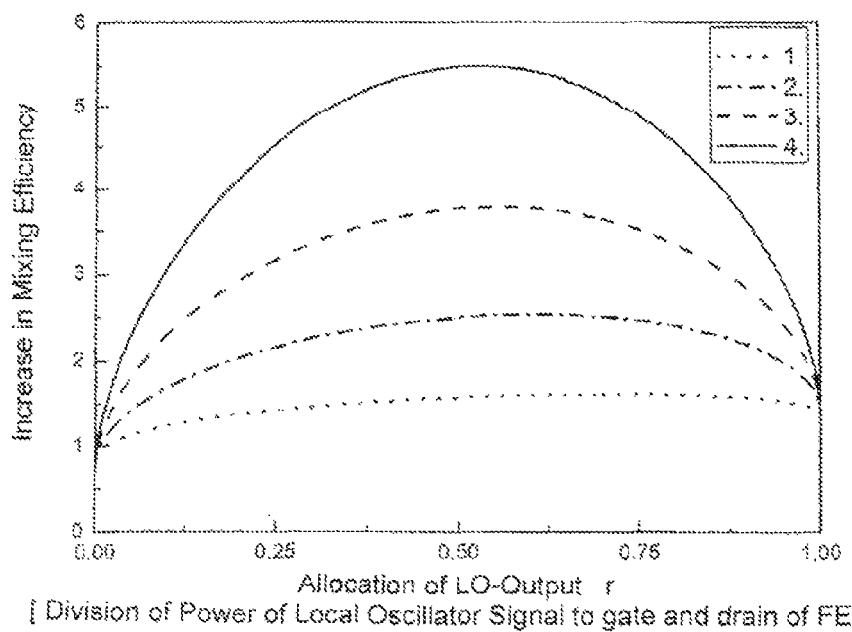
FIG. 6 shows a graph plotting the increase in mixing efficiency against the division of power of the local oscillator signal to gate and drain of the field effect transistor.
Figure 7:
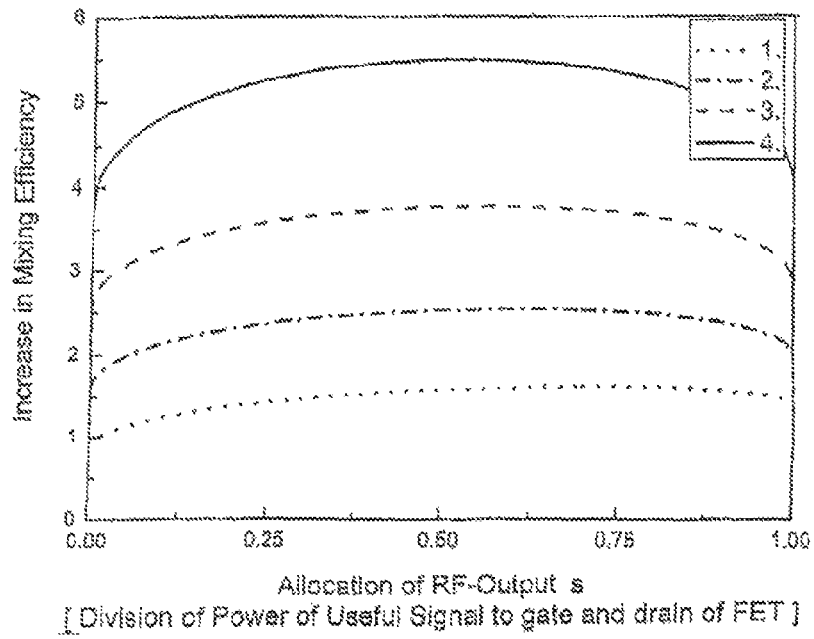
FIG. 7 shows a graph plotting the increase in mixing efficiency against the division of power of the useful signal to gate and drain of the field effect transistor.

FIGS. 6 and 7 each show an increase in mixing efficiency in relation to a variation in the factors r and s respectively. It will be seen that the optimum mixing efficiency does not occur as initially to be expected with an equal division of the available power of the local oscillator signal (FIG. 6) and the useful signal RF (FIG. 7) respectively.

While the optimum phase shift for all considered subharmonics 1 through 4 of the useful signal RF is equal the optimum in the parameters r and s varies in dependence on which subharmonic of the useful signal is used as the local oscillator signal. If the local oscillator signal used is a local oscillator frequency at the first subharmonic then the optimum of the parameters are at $r=s=0.724$, at the second subharmonic at $r=s=0.609$, at the third subharmonic at $r=s=0.555$ and at the fourth subharmonic at $r=s=0.529$. If the order of the subharmonics is allowed to go towards infinity then $r=s=0.5$ for the optimum. It is found however that the deviation from the optimum with a uniform division of the powers of the useful signal RF and the local oscillator signal LO to gate and drain, that is to say $r=s=0.5$, is not serious even at the first through fourth subharmonics.

Figure 8:
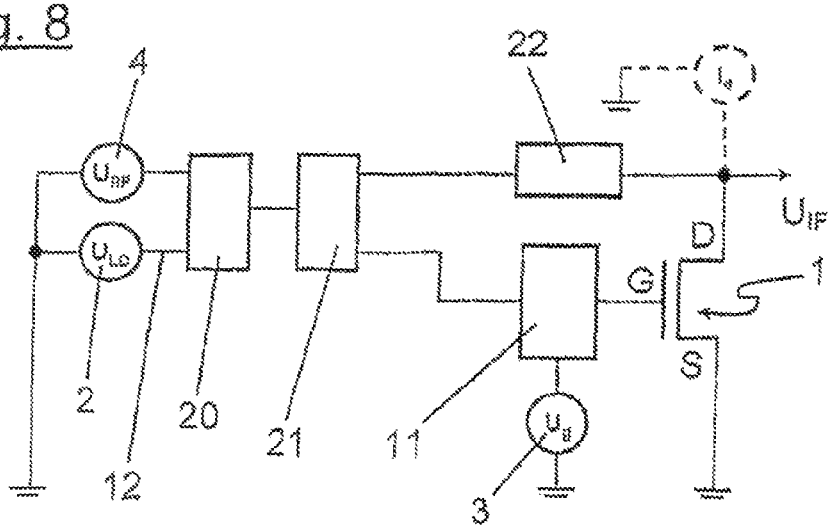
FIG. 8 shows a second embodiment of the electronic mixer according to the invention.

FIG. 8 shows an alternative embodiment of the mixer circuit which in contrast to the FIG. 2 embodiment manages with only one single combinator 20, a single splitter 21 and a single phase-shifting element 22.

As previously the useful signal RF is provided by an antenna 4 and the local oscillator signal LO is generated by a local oscillator 2. The two signals RF and LO are brought together in the combinator 20 and mutually superimposed wherein the superimposed signal is divided by the splitter to two paths which respectively contain signal components of the useful signal RF and the local oscillator signal LO. The first output of the splitter 21 is connected to the drain of the field effect transistor 1 while the second output of the splitter 21 is connected to the gate of the field effect transistor 1. To introduce a phase shift both between the signal components of the useful signal RF at gate G and drain D of the field effect transistor 1 and also between the signal components of the local oscillator signal LO at gate G and drain D of the field effect transistor 1 a delay section 22 is provided as a phase-shifting element between the splitter 21 and the drain D. If the delay section is so adjusted that it introduces any phase shift between 0 and $2\pi$ for the useful signal then the same delay section will also produce a phase shift of between 0 and $2\pi$ for the local oscillator signal LO. If however both phase shifts are $\pi$ or 180° respectively then the delay section 22 must be precisely set in such a way that it is 180° for the useful signal RF relative to the signal component of the useful signal, at the gate G of the field effect transistor 1. If now the local oscillator frequency $v_{LO}$ is so selected that it is an odd integral fraction of the useful frequency $v_{RF}$ reduced by the mixing frequency $v_{IF}$ then the delay section 22 also has a phase shift of $\pi$ and 180° respectively for the local oscillator signal LO.

Figure 12:
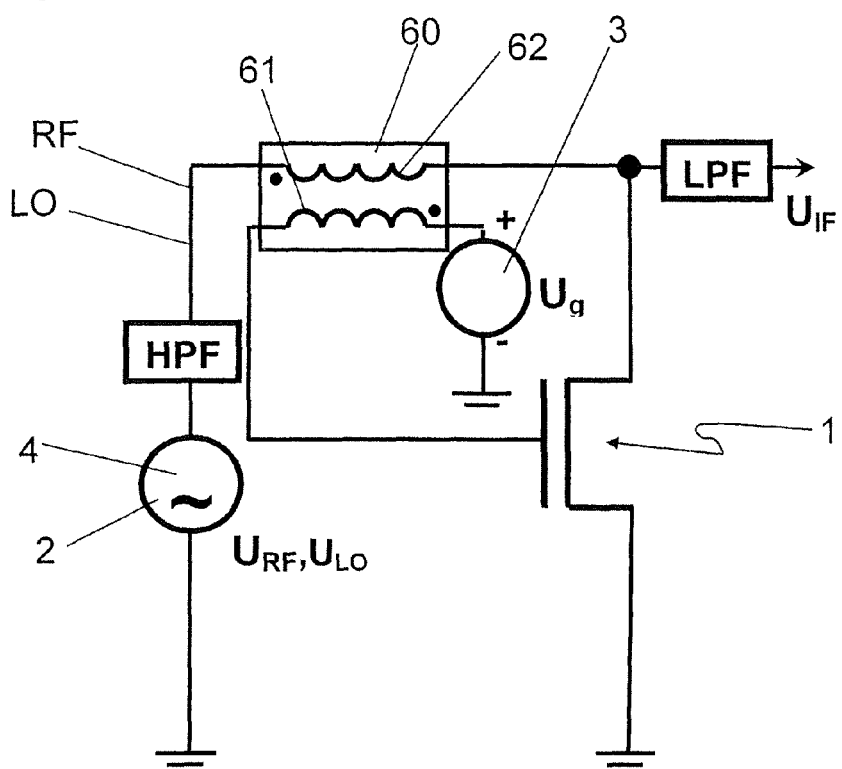
FIG. 12 shows a variant of the mixer according to the invention of FIG. 8.

FIG. 12 shows an embodiment of the mixer according to the invention which like the embodiment of FIG. 8 manages with only one single combinator. The single splitter is formed by a transformer 60. For simplification purposes the combinator is not shown in the FIG. 12 embodiment, but the local oscillator 2 and the antenna 4 are shown diagrammatically as a single source 2, 4.

In a technical implementation of the circuit shown in FIG. 12 an antenna 4''' is used, as is shown in FIG. 13. It forms the combinator and antenna and replaces the diagrammatic source 2, 4 for the useful signal RF and the local oscillator signal LO in FIG. 12. The antenna 4''' in FIG. 13 is a dual-frequency antenna comprising a metal layer as a ground plane, a dielectric and a metal patch 70 on the dielectric. The metal patch 70 forms a patch antenna for the useful signal RF. Four square openings 71, 72, 73, 74 are structured into the metal patch 70, that is to say in those regions the metal layer is missing on the dielectric. The openings 71, 72, 73, 74 form four slot antennas in the metal layer for the local oscillator signal so that at the points P1, P2, P3 and P4 a superimposition as between the useful signal RF and the local oscillator signal LO can be respectively tapped off and fed into the circuit in FIG. 12.

The superimpositioning of useful signal RF and local oscillator signal LO is divided by means of a transformer 60 in such a way that the high frequency signal RF and the local oscillator signal LO are applied both at the gate G and also the drain D of the field effect transistor 1. In that respect the primary coil 61 of the transformer 60 is connected between the combinator and the drain of the field effect transistor 1 while the secondary coil 62 is connected between the gate bias voltage $U_g$ and the gate G of the field effect transistor 1. There is an electromagnetic coupling between the primary coil 61 and the secondary coil 62.

By virtue of the inherent properties of the transformer 60 it provides as a splitter not only for division of the useful signal RF and the local oscillator signal LO to gate G and drain D of the field effect transistor 1, but also for the phase shift according to the invention between the signal components of the useful signal RF at gate G and drain D and between the signal components of the local oscillator signal LO at gate G and drain D.

FIG. 9 shows a further alternative embodiment which is based on the specific properties of a differential antenna 4'.

An embodiment by way of example of such a differential antenna 4' is shown in FIG. 10. The illustrated folded half-wave longitudinal dipole antenna 4' is so selected that it is resonant for the useful signal incident on the antenna 4', at a useful frequency $v_{RF}$. Then, the useful signal RF occurs at the connecting points 4a' and 4b' with a phase shift of π between the signal components at the connection 4a' and at the connection 4b'. In other words the differential antenna 4' has a two-wire output.

In contrast to the embodiments of FIGS. 2 and 8 the mixer circuit of FIG. 9 has two field effect transistors 50, 51. While the gate G of the first transistor 50 is supplied with the signal component of the useful signal outputted by the connection 4b' of the antenna 4' the gate G of the second field effect transistor 51 is supplied with the signal component of the useful signal at the first output 4a' of the differential antenna 4'. The supply to the drains D of the two field effect transistors 50, 51 is implemented with the useful signal in precisely converse fashion. While the first output of the antenna 4a' is connected to the drain of the first field effect transistor 50 the second output 4b' of the differential antenna 4' is connected to the drain of the second field effect transistor 51.

To achieve that, the arrangement has a first splitter 52 which is connected to the first connection 4a' of the differential antenna and which so divides the signals that the first connection 4a' of the antenna is connected both to the drain of the first field effect transistor 50 and also to the gate of the second field effect transistor 51. In the same way the second output 4b' is connected to a second splitter 53 which in turn connects the second output 4b' of the differential antenna 4' to the gate of the first field effect transistor 50 and the drain of the second field effect transistor 51. In that way there is a phase shift of 180° for the useful signal both between the gate and the drain of the first field effect transistor 50 and also between the gate and the drain of the second field effect transistor 51.

If, as shown in FIG. 9, the local oscillator signal LO generated by the local oscillator 2 is fed into the antenna 4' at the symmetry point 4c' of the latter then the antenna 4' acts for the local oscillator signal LO as a splitter and the local oscillator signal occurs at the output connections 4a' and 4b' of the antenna 4' without a phase shift between the two signal components.

Alternatively the feed of the local oscillator signal LO by the local oscillator into the differential antenna 4' can be implemented asymmetrically so that, by virtue of different local oscillator signal transit times, the signal components at the output connections 4a' and 4b' of the antenna 4' already have a phase shift relative to each other, preferably of 180°.

In the FIG. 9 embodiment the differential antenna 4' acts both as a phase-shifting element for the useful signal or for the useful signal and for the local oscillator signal and also as a combinator for the useful signal and the local oscillator signal.

The capacitors 54, 55 provided upstream of the drains in the FIG. 9 circuit serve as high-pass filters to decouple the gate bias voltage of the bias voltage source 3 from the drains.

Figure 11:
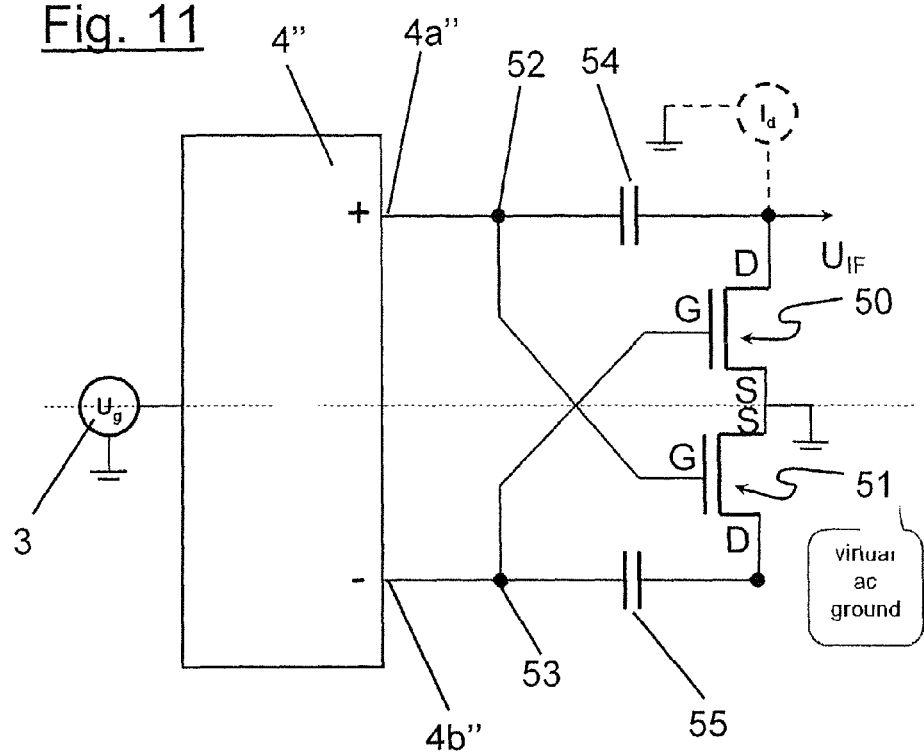
FIG. 11 shows a variant of the mixer according to the invention of FIG. 9.

FIG. 11 shows a further embodiment of a mixer according to the invention. The structure of the mixer of FIG. 11 substantially corresponds to that of the FIG. 9 mixer. As previously identical elements are denoted by identical references. It will be seen however that both the useful signal and also the local oscillator signal are coupled into the mixer by way of the differential antenna 4" in freely radiating relationship. For that purpose the differential antenna 4" is resonant both for the useful signal and also for the local oscillator signal.

In this embodiment the differential antenna 4" combines the following functions in itself: it is the useful signal input and the local oscillator input. It is the combinator for bringing the useful signal and the local oscillator signal together. It is the phase-shifting element both for the useful signal and also for the local oscillator signal.

At the connecting points 4a" and 4b" of the antenna 4" both the useful signal RF and also the local oscillator signal LO with a phase shift of π between the signal components occur at the connection 4a" and the connection 4b".

As previously in the FIG. 9 circuit the mixer circuit of FIG. 11 also has two field effect transistors 50, 51. While the gate G of the first transistor 50 is supplied with the signal components of the useful signal and the local oscillator signal outputted by the connection 4b" of the antenna 4" the gate G of the second field effect transistor 51 is supplied with the signal components of the useful signal and the local oscillator signal which occur at the first output 4a" of the differential antenna 4". The supply to the drains D of the two field effect transistors 50, 51 is implemented with the useful signal and the local oscillator signal in precisely the converse fashion. While the first output of the antenna 4a" is connected to the drain of the first field effect transistor 50 the second output 4b" of the differential antenna 4" is connected to the drain of the second field effect transistor 51.

To achieve that the arrangement has a first splitter 52 which is connected to the first connection 4a" of the differential antenna and which so divides the signals that the first connection 4a" of the antenna is connected both to the drain of the first field effect transistor 50 and also to the gate of the second field effect transistor 51. In the same way the second output 4b" is connected to a second splitter 53 which in turn connects the second output 4b" of the differential antenna 4" to the gate of the first field effect transistor 50 and the drain of the second field effect transistor 51. In that way there is a phase shift of 180° for the useful signal and the local oscillator signal both between the gate and the drain of the first field effect transistor 50 and also between the gate and the drain of the second field effect transistor 51.

For the purposes of the original disclosure it is pointed out that all features as can be seen by a man skilled in the art from the present description, the drawings and the claims, even if they are described in specific terms only in connection with certain other features, can be combined both individually and also in any combinations with others of the features or groups of features disclosed here insofar as that has not been expressly excluded or technical factors make such combinations impossible or meaningless. A comprehensive explicit representation of all conceivable combinations of features is dispensed with here only for the sake of brevity and readability of the description.

While the invention has been illustrated and described in detail in the drawings and the preceding description that illustration and description is only by way of example and is not deemed to be a limitation on the scope of protection as defined by the claims. The invention is not limited to the disclosed embodiments.

Modifications in the disclosed embodiments are apparent to the man skilled in the art from the drawings, the description and the accompanying claims. In the claims the word 'have' does not exclude other elements or steps and the indefinite article 'a' does not exclude a plurality. The mere fact that certain features are claimed in different claims does not exclude the combination thereof. References in the claims are not deemed to be a limitation on the scope of protection.

LIST OF REFERENCES 1 field effect transistor
2 local oscillator
3 bias voltage source
4 antenna
4', 4" differential antenna
4a', 4a" connection point
4b', 4b" connection point
4c' symmetry point
4" dual-frequency antenna
5 first splitter
6 phase shifter
7 first combinator
8 second combinator
9 second splitter
10 phase shifter
11 bias tee
12 local oscillator input
20 combinator
21 splitter
22 delay section
50 first field effect transistor
51 second field effect transistor
52 first splitter
53 second splitter
54 capacitor
55 capacitor
60 transformer
61 primary coil
62 secondary coil
70 metal patch
71-47 openings
P1-P4 tapping points
G gate
D drain
S source
LO local oscillator signal
$U_{LO}$ local oscillator voltage
RF high frequency signal
$U_{RF}$ useful signal voltage
IF intermediate frequency signal
$U_{IF}$ signal output for the intermediate frequency signal
RF mixed signal
$v_{IF}$ mixing frequency
$v_{RF}$ useful frequency
$v_{LO}$ local oscillator frequency
$U_{DS}$ drain-source voltage
$U_{GS}$ gate-source voltage

The invention claimed is:

1. An electronic mixer for generating a mixed signal (IF) by mixing a local oscillator signal (LO) with a useful signal (RF) comprising:

at least one field effect transistor which has at least one gate (G), at least one source (S), and at least one drain (D), a useful signal input for feeding in the useful signal with a useful frequency ($V_{RF}$), a local oscillator signal input for feeding in the local oscillator signal (LO), which is so designed that in operation the mixer receives the local oscillator signal (LO) whose local oscillator frequency ($v_{LO}$) is an integral fraction of the useful frequency ($V_{RF}$) of the useful signal, that is reduced or increased by a mixing frequency ($V_{IF}$) of the mixed signal (IF), and a signal output at which the mixed signal (IF) is present in operation of the mixer, characterised in that, the mixer is so adapted that in operation of the mixer to generate at least one of a gate-source voltage ($U_{GS}$), or a drain-source voltage, at least one of
one gate (G) of the field effect transistor,
or the drain (D),
or the source (S),
receive the useful signal (RF) from the useful signal input, the mixer is so adapted that in operation of the mixer to generate a gate-source voltage ($U_{GS}$), at least one gate (G) of the field effect transistor receives the local oscillator signal (LO) from the local oscillator signal input, and the mixer is so adapted that in operation of the mixer, the drain (D), or the source (S), of the field effect transistor for generating a drain-source voltage receives the local oscillator signal (LO) from the local oscillator signal input, and wherein the mixer is so adapted that in operation of the mixer a phase shift of between 0° and 360° is introduced between the local oscillator signal (LO) received by the gate (G) of the field effect transistor and the local oscillator signal (LO) received by the drain (D) or the source (S) of the field effect transistor, wherein the mixer has a first splitter, a second splitter, a first phase-shifting element, a second phase-shifting element, a first combinator and a second combinator, wherein the first splitter is so adapted that in operation the mixer receives the useful signal (RF) from the useful signal input, and outputs the useful signal (RF) to the gate (G) and the drain (D) or the source (S), wherein the second splitter is so adapted that in operation of the mixer receives the local oscillator signal (LO) from the local oscillator signal input, and outputs the local oscillator signal (LO) to the gate (G) and the drain (D) or the source (S), wherein the first phase-shifting element is between the first splitter and the gate (G) of the field effect transistor, or between the first splitter and the drain (D) or the source (S) of the field effect transistor, and wherein the first phase-shifting element is so adapted that the first phase-shifting element introduces a phase shift between the useful signal (RF) received by the gate (G) of the field effect transistor and the useful signal (RF) received by the drain (D) or the source (S) of the field effect transistor, wherein the second phase-shifting element is between the second splitter and the gate (G) of the field effect transistor, or between the second splitter and the drain (D) or the source (S) of the field effect transistor, and wherein the second phase-shifting element is so adapted that the second phase-shifting element introduces a phase shift, between the local oscillator signal (LO) received by the gate (G) of the field effect transistor and the local oscillator signal (LO) received by the drain (D) or the source (S) of the field effect transistor, wherein the first combinator is so adapted that in operation of the mixer, the first combinator receives the useful signal (RF) from the first splitter and the local oscillator signal (LO) from the second splitter, and outputs the useful signal (RF) and the local oscillator signal (LO) to the drain (D), or the source, of the field effect transistor, wherein the second combinator is so adapted that, in operation the mixer, the second combinator receives the useful signal (RF) from the first splitter and the local oscillator signal (LO) from the second splitter and outputs the useful signal (RF) and the local oscillator signal (LO) to the gate (G) of the field effect transistor.

2. An electronic mixer for generating a mixed signal (IF) by mixing a local oscillator signal (LO) with a useful signal (RF) comprising
at least one field effect transistor which has at least one gate (G), at least one source (S) and at least one drain (D),
a useful signal input for feeding in the useful signal with a useful frequency (VRF),
a local oscillator signal input for feeding in the local oscillator signal (LO), which is so designed that in operation the mixer receives the local oscillator signal (LO) whose local oscillator frequency ($V_{LO}$) is an integral fraction of the useful frequency ($V_{RF}$) of the useful signal, that is reduced or increased by a mixing frequency ($V_{IF}$) of the mixed signal (IF), and
a signal output at which the mixed signal (IF) is present in operation of the mixer,
characterised in that,
the mixer is so adapted that in operation of the mixer to generate at least one of a gate-source voltage ($U_{GS}$), or a drain-source voltage at least one of
one gate (G) of the field effect transistor,
or the drain (D),
or the source (S),
receive the useful signal (RF) from the useful signal input,
the mixer is so adapted that in operation of the mixer to generate a gate-source voltage ($U_{GS}$) at least one gate (G) of the field effect transistor receives the local oscillator signal (LO) from the local oscillator signal input, and
the mixer is so adapted that in operation of the mixer the drain (D) or the source (S) of the field effect transistor for generating a drain-source voltage receives the local oscillator signal (LO) from the local oscillator signal input, and
wherein the mixer is so adapted that in operation of the mixer a phase shift of between 0° and 360° is introduced between the local oscillator signal (LO) received by the gate (G) of the field effect transistor and the local oscillator signal (LO) received by the drain (D), or the source (S), of the field effect transistor,
wherein the local oscillator signal input is connected to a local oscillator for generating the local oscillator signal (LO), wherein the local oscillator is so adapted that in operation the mixer generates a local oscillator signal (LO) whose local oscillator frequency ($v_{LO}$) is an odd integral fraction of the useful frequency ($v_{RF}$) of the useful signal (RF), that is reduced or increased by a mixing frequency ($v_{IF}$) of the mixed signal (IF).

3. A mixer as set forth in one of claim 1 characterised in that the local oscillator signal input is connected to a local oscillator for generating the local oscillator signal (L0), wherein the local oscillator is so adapted that in operation the mixer generates the local oscillator signal (LO) whose local oscillator frequency ($v_{LO}$) is an integral fraction of the useful frequency ($v_{RF}$) of the useful signal (RF), that is reduced or increased by a mixing frequency ($v_{IF}$) of the mixed signal (IF).

4. A mixer as set forth in one of claim 1 characterised in that the phase-shifting element is a delay section, an electronic delay element or a geometrical phase shifter.

5. A mixer as set forth in one of claim 1 characterised in that the mixer has a bias voltage source for generating a dc voltage, wherein the dc voltage in operation of the mixer is present at the gate (G) of the field effect transistor.

6. A method of generating a mixed signal (IF) by mixing a local oscillator signal (LO) with a useful signal (RF) in at least one field effect transistor having at least one gate (G), at least one source (S), and at least one drain (D),
comprising the step:
generating the local oscillator signal (LO) with a local oscillator frequency ($v_{LO}$), wherein the local oscillator frequency ($v_{LO}$) is an integral fraction of the useful frequency ($v_{RF}$) of the useful signal, that is reduced or increased by the mixing frequency ($v_{IF}$) of the mixed signal (IF),
characterised in that the method additionally comprises the steps:
feeding the useful signal having a useful frequency ($v_{RF}$) into at least one of at least one gate (G) or the drain (D) or the source (S) of the field effect transistor,
feeding the local oscillator signal (LO) into at least one gate (G) and the drain (D), or the source (S), of the same field effect transistor, and
introducing a phase shift of 180° between the local oscillator signal (LO) at the gate (G) and the local oscillator signal (LO) at the drain (D) or the source of the field effect transistor.

7. A method of generating a mixed signal (IF) as set forth in claim 6 characterised in that the useful signal having a useful frequency ($v_{RF}$) is fed into at least one gate (G) and the drain (D) or the source (S) of the field effect transistor, and a phase shift of between 0° and 360° is introduced both between the useful signal at the gate (G) and the useful signal at the drain (D) or the source (S) of the field effect transistor, and also between the local oscillator signal (LO) at the gate (G) and the local oscillator signal (LO) at the drain (D) or the source (S) of the field effect transistor.

8. An electronic mixer for generating a mixed signal (IF) by mixing a local oscillator signal (LO) with a useful signal (RF) comprising:
at least one field effect transistor which has at least one gate (G), at least one source (S) and at least one drain (D),
a useful signal input for feeding in the useful signal with a useful frequency (VRF),
a local oscillator signal input for feeding in the local oscillator signal (LO), which is so designed that in operation the mixer receives the local oscillator signal (LO) whose local oscillator frequency ($v_{LO}$) is an integral fraction of the useful frequency ($V_{RF}$) the useful signal, that is reduced or increased by a mixing frequency ($v_{IF}$) of the mixed signal (IF), and
a signal output at which the mixed signal (IF) is present in operation of the mixer,
characterised in that the mixer is so adapted that in operation of the mixer to generate at least one of a gate-source voltage $U_{GS}$ or a drain-source voltage at least one of
one gate (G) of the field effect transistor,
or the drain (D),
or the source (S) receive the useful signal (RF) from the useful signal input,
the mixer is so adapted that in operation of the mixer to generate a gate-source voltage ($U_{GS}$) at least one gate (G) of the field effect transistor receives the local oscillator signal (LO) from the local oscillator signal input, and
the mixer is so adapted that in operation of the mixer the drain (D), or the source (S), of the field effect transistor for generating a drain-source voltage receives the local oscillator signal (LO) from the local oscillator signal input, and
wherein the mixer is so adapted that in operation of the mixer, a phase shift of between 0° and 360° is introduced between the local oscillator signal (LO) received by the gate (G) of the field effect transistor and the local oscillator signal (LO) received by the drain (D), or the source (S), of the field effect transistor,
wherein the mixer is so adapted that in operation of the mixer to generate a gate-source voltage ($U_{GS}$) and a drain-source voltage, at least one gate (G) of the field effect transistor and the drain (D), or the source (S), receive the useful signal (RF) from the useful signal input, wherein the mixer is so adapted that in operation of the mixer a phase shift of between 0° and 360°, is introduced between the useful signal (RF) received by the gate (G) of the field effect transistor and the useful signal (RF) received by the drain (D) or the source (S) of the field effect transistor, and also a phase shift of 180° is introduced between the local oscillator signal (LO) received by the gate (G) of the field effect transistor and the local oscillator signal (LO) received by the drain (D) or the source (S) of the field effect transistor.

9. A mixer according to claim 8 wherein the mixer is so adapted that in operation of the mixer a phase shift of 180° is introduced between the useful signal (RF) received by the gate (G) of the field effect transistor and the useful signal (RF) received by the drain (D) or the source (S) of the field effect transistor.

10. An electronic mixer for generating a mixed signal (IF) by mixing a local oscillator signal (LO) with a useful signal (RF) comprising
at least one field effect transistor which has at least one gate (G), at least one source (S) and at least one drain (D),
a useful signal input for feeding in the useful signal with a useful frequency ($V_{RF}$),
a local oscillator signal input for feeding in the local oscillator signal (LO), which is so designed that in operation the mixer receives the local oscillator signal (LO) whose local oscillator frequency ($v_L o$) is an integral fraction of the useful frequency of the useful signal, that is reduced or increased by a mixing frequency ($v_{IF}$) of the mixed signal (IF), and
a signal output at which the mixed signal (IF) is present in operation of the mixer,
characterised in that
the mixer is so adapted that in operation of the mixer to generate at least one of a gate-source voltage $U_{GS}$, or a drain-source voltage, at least one of
one gate (G) of the field effect transistor,
or the drain (D),
or the source (S)
receive the useful signal (RF) from the useful signal input,
the mixer is so adapted that in operation of the mixer to generate a gate-source voltage ($V_{GS}$) at least one gate (G) of the field effect transistor receives the local oscillator signal (LO) from the local oscillator signal input, and
the mixer is so adapted that in operation of the mixer the drain (D), or the source (S), of the field effect transistor for generating a drain-source voltage receives the local oscillator signal (LO) from the local oscillator signal input, and
wherein the mixer is so adapted that in operation of the mixer a phase shift of between 0° and 360° is introduced between the local oscillator signal (LO) received by the gate (G) of the field effect transistor and the local oscillator signal (LO) received by the drain (D), or the source (S), of the field effect transistor,
wherein the mixer has a first splitter, a second splitter, a first phase-shifting element, a second phase-shifting element, a first combinator and a second combinator,
wherein the first splitter is so adapted that in operation the mixer receives the useful signal (RF) from the useful signal input, and outputs the useful signal (RF) to the gate (G) and the drain (D) or the source (S),
wherein the second splitter is so adapted that in operation the mixer receives the local oscillator signal (LO) from the local oscillator signal input, and outputs the local oscillator signal (LO) to the gate (G) and the drain (D), or the source (S),
wherein the first phase-shifting element is between the first splitter and the gate (G) of the field effect transistor, or between the first splitter and the drain (D) or the source (S) of the field effect transistor, and wherein the first phase-shifting element is so adapted that the first phase-shifting element introduces a phase shift of 180° between the useful signal (RF) received by the gate (G) of the field effect transistor and the useful signal (RF) received by the drain (D) or the source (S) of the field effect transistor,
wherein the second phase-shifting element is between the second splitter and the gate (G) of the field effect transistor, or between the second splitter and the drain (D) or the source (S) of the field effect transistor, and wherein the second phase-shifting element is so adapted that the second phase-shifting element introduces a phase shift of 180° between the local oscillator signal (LO) received by the gate (G) of the field effect transistor and the local oscillator signal (LO) received by the drain (D) or the source (S) of the field effect transistor,
wherein the first combinator is so adapted that in operation of the mixer the first combinatory receives the useful signal (RF) from the first splitter and the local oscillator signal (LO) from the second splitter and outputs the useful signal (RF) and the local oscillator signal (LO) to the drain (D) or the source of the field effect transistor,
wherein the second combinator is so adapted that in operation of the mixer the second combinator receives the useful signal (RF) from the first splitter and the local oscillator signal (LO) from the second splitter and outputs the useful signal (RF) and the local oscillator signal (LO) to the gate (G) of the field effect transistor.

11. A mixer as set forth in one of claims 1, 10 and 2 characterised in that,
the mixer is so adapted that in operation of the mixer to generate a gate-source voltage ($U_{GS}$), and a drain-source voltage, at least one gate (G) of the field effect transistor and the drain (D) or the source (S) receive the useful signal (RF) from the useful signal input,
wherein the mixer is so adapted that in operation of the mixer a phase shift of between 0° and 360° is introduced between the useful signal (RF) received by the gate (G) of the field effect transistor and the useful signal (RF) received by the drain (D) or the source (S) of the field effect transistor, and also a phase shift of between 0° and 360° is introduced between the local oscillator signal (LO) received by the gate (G) of the field effect transistor and the local oscillator signal (LO) received by the drain (D) or the source (S) of the field effect transistor.

* * * * *

UNITED STATES PATENT AND TRADEMARK OFFICE
CERTIFICATE OF CORRECTION

Page 1 of 2

PATENT NO. : 9,190,956 B2
APPLICATION NO. : 13/697824
DATED : November 17, 2015
INVENTOR(S) : Roskos et al.

It is certified that error appears in the above-identified patent and that said Letters Patent is hereby corrected as shown below:

Specification

Column 10, Lines 1-18, replace the table as printed with the following table:

| Harmonic | Amplitude of the mixed signals |
|---|---|
| 1 | $\dfrac{1}{2} \dfrac{U_{LO} U_{RF}}{U_t}$ |
| 2 | $\dfrac{1}{8} \dfrac{U_{LO}^2 U_{RF}}{U_t^2}$ |
| 3 | $\dfrac{1}{48} \dfrac{U_{LO}^3 U_{RF}}{U_t^3}$ |
| 4 | $\dfrac{1}{384} \dfrac{U_{LO}^4 U_{RF}}{U_t^4}$ |
| n | $\dfrac{1}{2^n n!} \dfrac{U_{LO}^n U_{RF}}{U_t^n}$ |

Column 15, Line 29, change "4''" to -- 4''' --

Claims

Column 18, Line 1, Claim 3, delete "one of"

Column 18, Line 10, Claim 4, delete "one of"

Column 18, Line 13, Claim 5, delete "one of"

Column 18, Line 61, Claim 8, change "(V$_L$O)" to -- (V$_{LO}$) --

Signed and Sealed this
First Day of March, 2016

Michelle K. Lee
*Director of the United States Patent and Trademark Office*

CERTIFICATE OF CORRECTION (continued)
U.S. Pat. No. 9,190,956 B2

Column 18, Line 62, Claim 8, insert -- of -- before "the useful signal"

Column 19, Line 2, Claim 8, change " $U_{GS}$" to -- ($U_{GS}$) --

Column 19, Line 9, Claim 8, change "($U_GS$)" to -- ($U_{GS}$) --

Column 19, Line 55, Claim 10, change "($V_LO$)" to -- ($V_{LO}$) --

Column 19, Line 56, Claim 10, after "frequency" insert -- ($V_{RF}$) --

Column 19, Line 63, Claim 10, change "$U_{GS}$," to -- ($U_{GS}$), --